(12) United States Patent
Cho et al.

(10) Patent No.: US 7,897,512 B2
(45) Date of Patent: Mar. 1, 2011

(54) METHODS OF FORMING INTEGRATED CIRCUIT DEVICES INCLUDING A MULTI-LAYER STRUCTURE WITH A CONTACT EXTENDING THERETHROUGH

(75) Inventors: Hong Cho, Gyeonggi-do (KR);
Seung-Pil Chung, Seoul (KR);
Dong-Seok Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 213 days.

(21) Appl. No.: 12/132,755

(22) Filed: Jun. 4, 2008

(65) Prior Publication Data

US 2009/0026526 A1 Jan. 29, 2009

(30) Foreign Application Priority Data

Jul. 24, 2007 (KR) ...................... 10-2007-0074099

(51) Int. Cl.
*H01L 29/72* (2006.01)

(52) U.S. Cl. ...................... 438/672; 438/107; 438/109; 438/598; 438/618; 438/675; 257/773; 257/774; 257/777

(58) Field of Classification Search ................ 438/107, 438/109, 598, 618, 672, 675; 257/773, 774, 257/777
See application file for complete search history.

(56) References Cited

U.S. PATENT DOCUMENTS

2008/0009115 A1 * 1/2008 Willer et al. ................ 438/257
2008/0283838 A1 * 11/2008 Ishikawa ...................... 257/59

FOREIGN PATENT DOCUMENTS

| KR | 100577603 | 5/2006 |
| KR | 100583972 | 5/2006 |
| KR | 1020060057821 | 5/2006 |

* cited by examiner

*Primary Examiner*—Edward Wojciechowicz
(74) *Attorney, Agent, or Firm*—Myers Bigel Sibley & Sajovec

(57) ABSTRACT

Integrated circuit devices have a first substrate layer and a first transistor on the first substrate layer. A first interlayer insulating film covers the first transistor. A second substrate layer is on the first interlayer insulating film and a second transistor is on the second substrate layer. A second interlayer insulating film covers the second transistor. A contact extends through the second interlayer insulating film, the second substrate layer and the first interlayer insulating film. The contact includes a lower contact and an upper contact that contacts an upper surface of the lower contact to define an interface therebetween. The interface is located at a height no greater than a height of a top surface of the second substrate and greater than a height of a bottom surface of the second substrate layer.

21 Claims, 6 Drawing Sheets

METHODS OF FORMING INTEGRATED CIRCUIT DEVICES INCLUDING A MULTI-LAYER STRUCTURE WITH A CONTACT EXTENDING THERETHROUGH

CROSS-REFERENCE TO RELATED APPLICATION

This application relates to and claims priority under 35 U.S.C. §119 from Korean Patent Application No. 10-2007-0074099 filed on Jul. 24, 2007, in the Korean Intellectual Property Office, the disclosure of which is incorporated herein by reference in its entirety.

BACKGROUND OF THE INVENTION

The present invention relates to semiconductor (integrated circuit) devices and methods of forming the same, and, more particularly, to semiconductor devices including laminated semiconductor layers and methods of forming the same.

Semiconductor (integrated circuit) devices are used in various applications, including microcontrollers, credit cards and the like. Integrated circuit devices can be classified as volatile integrated circuit devices, which typically have fast data input/output speeds but lose data over time. Examples of volatile integrated circuit devices include a dynamic random access memory (DRAM) and static RAM. Integrated circuit devices can also be classified as non-volatile integrated circuit devices, which generally have relatively (compared to volatile devices) slow data input/output speeds but store data permanently. An example of a non-volatile device is a read only memory (ROM). In addition, non-volatile devices have been developed, such as electrical erasable programmable read only memories EEPROMs and Flash memory devices, which can electrically input/output data.

A large storage capacity and high integration in integrated circuit devices has become ever more important as devices including these storage components, such as information communication devices, include ever more advanced functions. Consequently, the size decrease of memory cells, which include integrated circuit devices, has been accelerated in recent years. As the size decrease due to minimization of memory cell sizing, a lithography process commonly used to form such devices is reaching its technical limit. Thus, to overcome this process limit, a method of fabricating a semi-conductor integrated circuit device, in which memory cells are laminated in a manner to overlap each other, has been studied so that higher integration can be achieved without further shrinking the size of the memory cell. However, if the height of a memory cell increases due to the laminating of the memory cells in several layers, problems may occur in the patterning procedure for forming contacts. This may cause a significant decrease in the process margin of the contact-forming procedure.

SUMMARY OF THE INVENTION

Embodiments of the present invention include integrated circuit devices having a first substrate layer and a first transistor on the first substrate layer. A first interlayer insulating film covers the first transistor. A second substrate layer is on the first interlayer insulating film and a second transistor is on the second substrate layer. A second interlayer insulating film covers the second transistor. A contact extends through the second interlayer insulating film, the second substrate layer and the first interlayer insulating film. The contact includes a lower contact and an upper contact that contacts an upper surface of the lower contact to define an interface therebetween. The interface is located at a height no greater than a height of a top surface of the second substrate and greater than a height of a bottom surface of the second substrate layer.

In other embodiments, the first transistor is a plurality of first transistors and the second transistor is a second plurality of transistors. A bottom surface of the lower contact contacts a source/drain region of one of the first transistors. The contact may penetrate a source/drain region of the second transistor. The lower contact and the upper contact may be different materials. For example, the lower contact may be polysilicon and the upper contact may be a metal.

In other embodiments, each of the first transistors includes a gate stricture, the gate structure including a tunneling film, a floating gate on the tunneling film, an inter-gate insulating film on the floating gate and a control gate on the inter-gate insulating film. Each of the first transistors may include a gate structure, the gate electrode structure including an electrode trap structure and a gate electrode on the electrode trap structure. The electrode trap structure may include a tunneling film, an electrode trap layer on the tunneling film and a blocking layer on the electrode trap layer.

In further embodiments, at least two first transistors are coupled in series to define a NAND circuit. The first transistors may define a plurality of NAND circuits and the contact may be a plurality of contacts, ones of which are coupled to corresponding source/drain regions associated with respective ones of the NAND circuits. A bit line may be provided on the second interlayer insulating film that is connected to a top surface of the upper contact.

In other embodiments, the first substrate layer is a semiconductor substrate and the second substrate layer is a semiconductor substrate bonded to the first interlayer insulating film, an epitaxy layer or a silicon layer that is single-crystallized or polycrystallized.

In yet further embodiments, the integrated circuit device includes a cell array region and a peripheral circuit region. The first and second transistor(s) and the contact(s) are formed on the cell array region. The second substrate layer does not extend into the peripheral circuit region. The peripheral circuit region includes the first substrate layer, the first interlayer insulating layer, the second interlayer insulating layer and a gap-filling interlayer insulating film between the first and second interlayer insulating layers corresponding to the second substrate layer in the cell array region. A further contact extends through the first interlayer insulating layer, the second interlayer insulating layer and the a gap-filling interlayer insulating film. The further contact includes a lower contact and upper contact corresponding to the lower contact and the upper contact of the contact in the cell array region.

In other embodiments, methods of forming an integrated circuit device include forming a plurality of first transistors on a first substrate layer. A first interlayer insulating film is formed that covers the plurality of transistors. A second substrate layer is formed on the first interlayer insulating film. A plurality of second transistors are formed on the second substrate layer. A lower contact is formed that extends through the second substrate layer and the first interlayer insulating film. A top surface of the lower contact is located at a height no greater than a height of a top surface of the second substrate layer and greater than a height of a bottom surface of the second substrate layer. A second interlayer insulating film is formed that covers the lower contact and the plurality of second transistors. An upper contact is formed that extends through the second interlayer insulating film to contact the top surface of the lower contact.

In yet other embodiments, a bottom surface of the lower contact contacts a source/drain region associated with the plurality of first transistors. Forming the lower contact may include forming a first mask pattern and a second mask pattern on the second substrate layer, etching the second substrate layer and the first interlayer insulating layer film to form a lower contact hole that exposes a part of the source/drain region using the first and second mask patterns as etching masks, filling the lower contact hole with a lower contact conductive film and removing a portion of the lower contact conductive film that exceeds a height of the top surface of the second substrate layer. Filling the lower contact hole may be preceded by removing the first and second mask patterns.

In further embodiments, forming the first and second mask patterns includes sequentially forming first and second mask-patterning films on the second substrate layer including the plurality of second transistors, forming a photo-resist pattern on the second mask-patterning film and etching the second mask-patterning film and the first mask-patterning film using the photo-resist pattern as an etching mask to form the first and second mask pattern. The first mask-patterning film may be an organic material containing carbon and forming the first mask-patterning film may include forming the first mask-patterning film by a chemical vapor disposition method and/or a coating method.

In other embodiments, each of the first transistors includes a gate structure that includes a tunneling film, a floating gate, an inter-gate insulating film, and a control gate. Forming the upper contact may be followed by forming a bit line on the second interlayer insulating film, the bit line being connected to the upper contact. The first substrate layer may be a semiconductor substrate and the second substrate layer may be a semiconductor substrate bonded to the first interlayer insulating film, an epitaxy layer, or a silicon layer that is single-crystallized or polycrystallized after deposition.

BRIEF DESCRIPTION OF THE DRAWINGS

The above and other features and advantages of the present invention will become apparent from the following detailed description taken in conjunction with the accompanying drawings, in which.

DETAILED DESCRIPTION OF THE INVENTION

Figure 1:
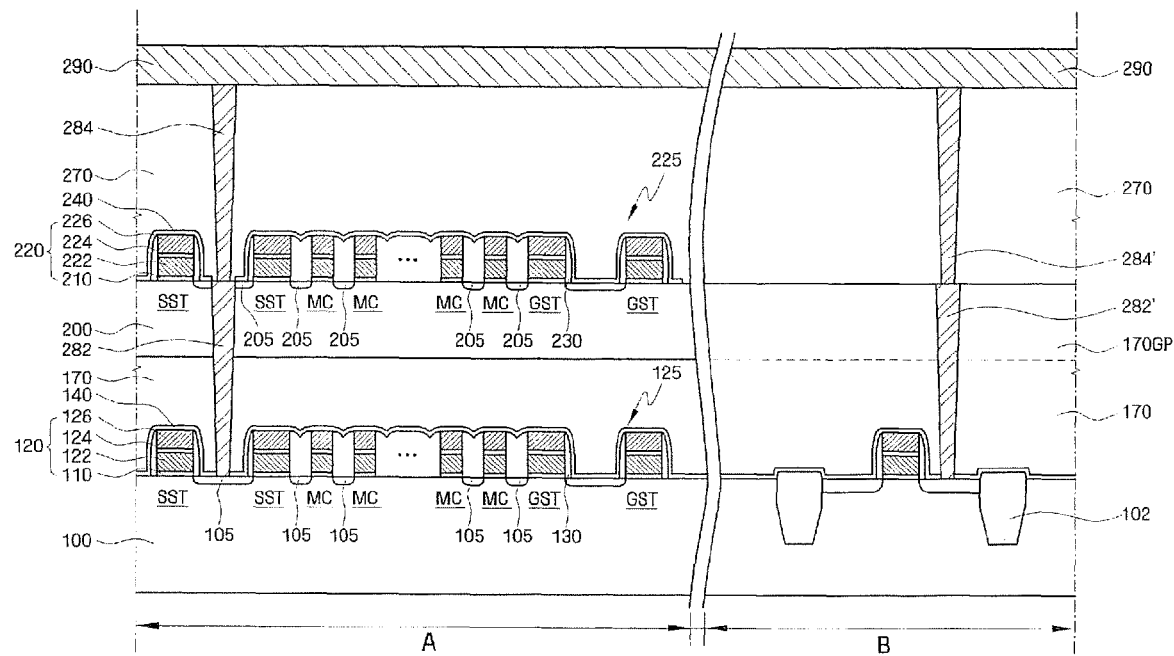
FIG. 1 is a cross-sectional view of an integrated circuit device according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

An integrated circuit device will be described herein with reference to the accompanying drawings in which some embodiments of the present invention are shown. In particular, the present invention will be described with reference to a NAND type non-volatile integrated circuit device, in which two semiconductor layers are laminated, to facilitate understanding of the present invention. However, the present invention is not limited thereto, and the present invention can be applied to other integrated circuit devices in which two or more laminated semiconductor substrates or semiconductor layers are provided.

FIG. 1 is a cross-sectional view illustrating an integrated circuit device according to some embodiments of the present invention. As shown in the embodiments of FIG. 1, the illustrated integrated circuit device includes a first integrated circuit layer 100, first transistors 125, a first interlayer insulating film 170, a second integrated circuit layer 200, second transistors 225, a second interlayer insulating film 270, and a contact 282, 284.

The first integrated circuit layer 100 may be, for example, a semiconductor substrate. The first substrate 100 may be Si, Ge, SiGe, GaP, CaAs, SiC, SiGeC, InAs and/or InP. The first substrate 100 may be a silicon on insulator (SOI) substrate in some embodiments.

In the first substrate 100, isolation regions 102, such as shallow trench isolation (STI) films and/or LOCOS films, are shown formed to define a cell array region A and a peripheral circuit region B. A plurality of active regions may be repeatedly arranged (in a pattern) in the cell array region A. Furthermore, in the first substrate 100, wells may be formed in order to optimize the characteristics of transistors 125 and 225 formed in the cell array region A and the peripheral circuit region B. For example, the cell array region A may have pocket-type p-wells formed therein, and the peripheral circuit region B may have n-wells and p-wells formed therein.

The plurality of first transistors 125 are formed on the first substrate 100. The plurality of first transistors include string selection transistors SST, a plurality of memory cell transistors MC, and ground selection transistors GST. The first transistors 125 form a string by connecting to each other in series while sharing a source/drain region 105. As such, two or more transistors 125 connected to each other in series form a NAND-type circuit.

When a semiconductor integrated circuit device is a floating-trap type, such as silicon oxide nitride oxide semiconductor (SONOS), each of the first transistors 125 includes a gate structure 120 in which a tunneling film 110, a floating gate 122, an inter-gate insulating film 124, and a control gate 126 are laminated (overlap) each other. The first transistors 125 may include electrode trap structures and gate structures on which gate electrodes are laminated. The electrode trap structure may include a tunneling film, an electrode trap layer and a blocking layer. Further description of specific gate structures that may be used need not be provided herein and it will be understood that the present invention is not limited to the gate structures particularly discussed herein.

As seen in the embodiments of FIG. 1, the first interlayer insulating film 170 is formed on the plurality of first transistors 125. The first interlayer insulating film 170 is shown formed on both the cell array region A and the peripheral circuit region B. The first interlayer insulating film 170 may be made of, for example, a silicon oxide film. The thickness of the first interlayer insulating film 170 may be, for example, about 4000 Å.

The second integrated circuit layer 200 may also be a semiconductor substrate. The second semiconductor substrate layer 200 is formed on the cell array region A of the first interlayer insulating film 170. The second substrate layer 200 may be a semiconductor substrate that is bonded to the first interlayer insulating film 170, an epitaxy layer (e.g., using a growth mask on the first interlayer insulating film 170) and/or a silicon layer, which may be single crystallized or polycrystallized after being deposited on the first interlayer insulating layer 170.

When the second substrate layer 200 is a bonding-connected semiconductor substrate, the second substrate layer 200 may be made of the same material(s) as the first substrate 100. That is, the second substrate layer 200 may be Si, Ge, SiGe, GaP, CaAs, SiC, SiGeC, InAs, and/or InP or a silicon on insulator (SOI) substrate. The second substrate layer 200 may be formed of an epitaxy layer that is formed through an epitaxial growth process from the first substrate layer 100, or a silicon substrate that is single crystallized or polycrystallized after being deposited on the first substrate layer 100. The thickness of the second substrate layer 200 may be, for example, in the range of about 2000 to 3000 Å.

A gap-filling interlayer insulating film 170GP is shown disposed on the first interlayer insulating film 170 in the peripheral circuit region B that corresponds to the second substrate layer 200 in the cell array region A. The thickness of the gap-filling interlayer insulating film 170GP may be the same as the second substrate layer 200, and may be, for example, in the range of about 2000 to 3000 Å. The gap-filling interlayer insulating film 170GP may be made of the same materials as the first interlayer insulating film 170. For example, the gap-filling insulating film 170GP may be a silicon oxide film.

The plurality of second transistors 225 are formed on the second substrate layer 200. Although the first transistors 125 and the second transistors 225 in the cell array region are illustrated to have the same strictures in FIG. 1, the present invention is not limited to such an arrangement. That is, the second transistors 225 may have the same configurations as the first transistors 125, which are disposed below the second transistors 225, or may have different configurations than the first transistors 125.

The second interlayer insulating film 270 is formed on the plurality of second transistors 225 and on the gap-filling interlayer insulating film 170GP in the peripheral circuit region B. The second interlayer insulating film 270 may be made of the same materials as the first interlayer insulating film 170, such as a silicon oxide film. The thickness of the second interlayer insulating film 270 may be about 7000 Å.

As also illustrated in the embodiments of FIG. 1, on both a top surface of the first substrate layer 100 including the first transistors 125 disposed thereon and a top surface of the second substrate layer 200 including the second transistors 225 disposed thereon, respective etching stop films 140 and 240 are conformally formed. The etching stop films 140 and 240 may be formed of silicon nitride (SiN) and/or silicon oxide nitride (SiON), and the thickness thereof in some embodiments may be less than about 500 Å. For example, the thickness thereof may be in the range of about 200 to 300 Å. Moreover, respective sidewall spacers 130 and 230 may be formed on both sidewalls of the gate structures 120 and 220.

In the cell array region A, contacts 282, 284 are formed, penetrating the second interlayer insulating film 270, the etching stop films 140 and 240, the second substrate layer 200, and the first interlayer insulating film 170. The contacts 282, 284 are, respectively, an upper contact 284 and a lower contact 282 in the cell array region A, and the interface between the upper and lower contacts 284 and 282 may be located on the surface of the second substrate layer 200 or within the second substrate layer 200.

As shown in FIG. 1, in the cell array region A, the bottom surface of the lower contact 282 touches the source/drain region 105 of the first transistor 125, which is disposed on the first semiconductor layer 100.

When the second transistors 225 have the same configuration as the first transistors 125 as shown in FIG. 1, the contacts 282 and 284 penetrate the source/drain region 205 of the second transistor 225. The interface between the lower contact 282 and the upper contact 284 is located at the second semiconductor layer 200, and, more particularly, on the surface of the source/drain region 205 or within the source/drain region 205 of the second transistor 225 disposed on the second substrate layer 200.

In the peripheral circuit region B, contacts 282' and 284' are formed, penetrating the second interlayer insulating film 270, the gap-filling interlayer insulating film 170GP, and the etching stop film 140. Like contacts 282 and 284 in the cell array region A, the contacts 282' and 284' in the peripheral circuit region B include a lower contact 282' and an upper contact 284'. The interface between the lower contact 282' and the upper contact 284' may be located on the surface of the gap-filling interlayer insulating film 170GP or within the gap-filling interlayer insulating film 170GP. Each of the lower contacts 282 and 282' in the cell array region A and the peripheral circuit region B may be formed of a polysilicon film.

The upper contacts 284 and 284' may be formed of the same material as the lower contacts 282 and 282', or a different material from the lower contacts 282 and 282'. For example, in some embodiments, each of the lower contact 282 and 282' is made of a polysilicon film, and each of the upper contacts 284 and 284' is made of a metal film, such as W, Cu and/or Al. The upper contacts 284, 284' may be formed of a conductive material film, such as a polysilicon film.

A bit line 290, which is connected to the upper contacts 284 and 284', is shown formed on the second interlayer insulating film 270. When the upper contacts 284 and 284' are connected to the bit line 290, the lower contacts 282 and 282' and the upper contacts 284 and 284' form a bit line contact. However, the present invention is not limited to arrangements where a contact formed by the lower contacts 282 and 282' and the adjoining upper contacts 284 and 284' is the illustrated bit line contact.

As described above, the interface between the lower contact 282 and the upper contact 284 in the cell array region A may be located on the top surface of the second substrate layer 200 or within the second semiconductor layer 200, and the interface between the lower contact 282' and the upper contact 284' in the peripheral circuit region B may be located on the top surface of the gap-filling interlayer insulating film 170GP or within the gap-filling interlayer insulating film 170GP. As a result, the aspect ratio of the lower and upper contacts 282 and 282' and 284 ad 284' may decrease and bowing or a contact crack can be limited or even prevented. Moreover, a process margin of the contact-formation process in laminated semiconductor layers can be improved.

A method of forming the integrated circuit device described with reference to FIG. 1 according to some embodiments of the present invention will now be described with reference to FIGS. 2-10. For operations that may be implemented following the procedures well known in the art, only schematic or summary descriptions will be provided and any such details provided shall not be understand as limiting the scope of the present invention. In addition, the elements, structures, shapes, materials, dimensions and the like described with reference to FIG. 1 need not be further described herein.

Figure 2:
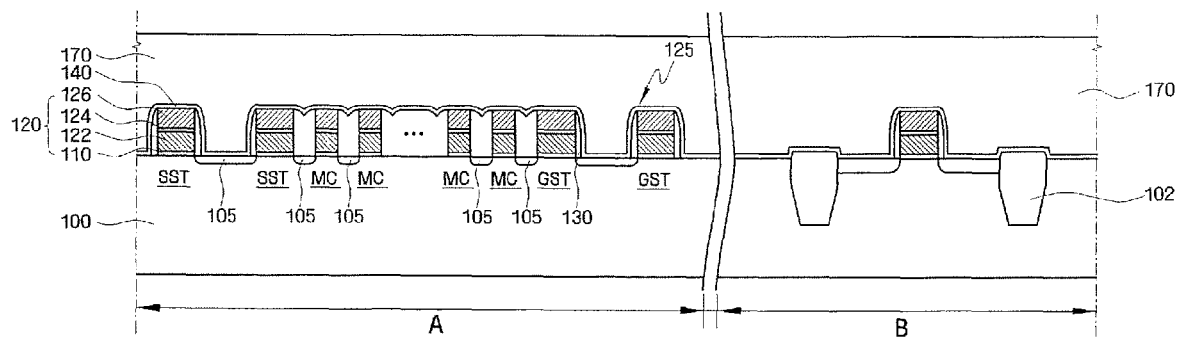
FIGS. 2 through 10 are cross-sectional views illustrating a method of forming an integrated circuit device according to some embodiments of the present invention.

FIGS. 2 to 10 are cross-sectional views of the integrated circuit device of FIG. 1 illustrating a method of forming the integrated circuit device of FIG. 1 according to some embodiments of the present invention. Referring to FIG. 2, the first transistors 125 and the first interlayer insulating film 170 are formed on the first substrate layer 100. The isolation region 102 is formed on the first substrate layer 100 to define the cell array region A and the peripheral circuit region B. The formation of the isolation region 102 may be performed using methods well known in the art; for example, a STI process and/or a LOCOS process.

The plurality of first transistors 125 are disposed on the first substrate layer 100. To form the first transistors 125, an insulating film (tunnel oxide layer), a conductive film (floating gate), an inter-gate insulating film, and a conductive film (control gate) are sequentially formed. The gate structure 120 is formed by patterning the laminated films so that the gate structure 120 includes the tunneling film 110, the floating gate 122, the inter-gate insulating film 124 and the control gate 126. The sidewall spacer 130 can be formed on each of the sidewalls of the gate structure 120. Impurity ions are implanted into the first substrate layer 100 on both sides of the gate structure 120 to form the source/drain region 105 and define the first transistors 125.

The etching stop film 140 is shown conformally formed on the top of the first transistors 125 and on the top of the first substrate layer 100 that is exposed by the first transistors 125. The etching stop film 140 may be formed, for example, by a chemical vapor deposition (CVD) method and/or an atomic layer deposition (ALD) method.

The first interlayer insulating film 170 is formed to cover the first transistors 125. The first interlayer insulating film 170 is formed on the first substrate layer 100 including the cell array region A and the peripheral circuit region B. The first interlayer insulating film 170 may be formed of, for example, a silicon oxide film.

Figure 3:
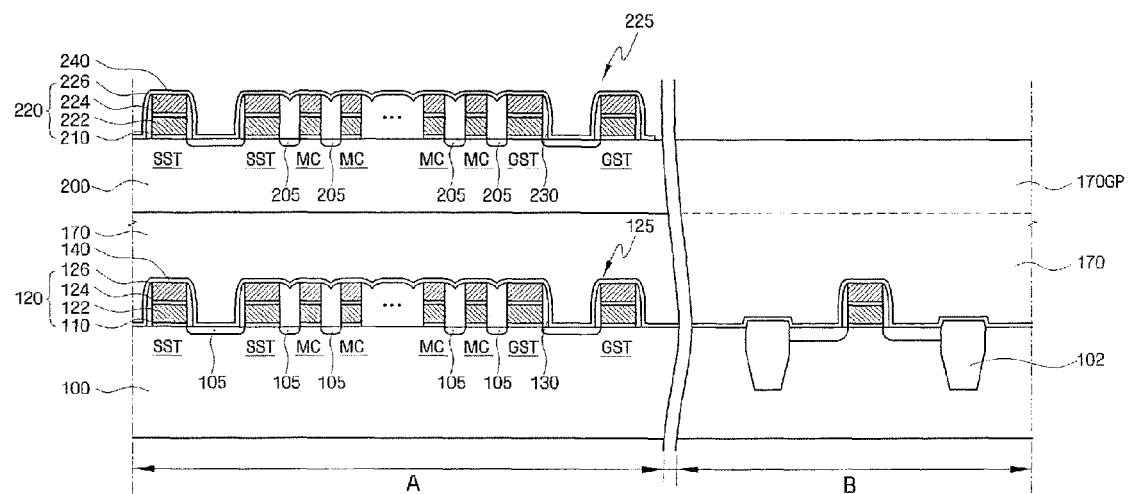

Referring now to FIG. 3, the second substrate layer 200 and the second transistors 225 are formed on the first interlayer insulating film 170. The second substrate layer 200 may be formed to cover the entire surface of the first interlayer insulating film 170, and then patterned to remain only in desired positions. For example, as shown in the embodiments of FIG. 3, the second substrate layer 200 can be formed to remain only on the cell array region A of the first substrate layer 100.

Next, the gap-filling interlayer insulating film 170GP is disposed on the first interlayer insulating layer 170 in the peripheral circuit region B. The gap-filling interlayer insulating film 170GP is shown formed to have the same height as that of the second substrate layer 200 in the cell array region A. The gap-filling interlayer insulating film 170GP may be formed of the same material as the first interlayer insulating film 170, and may be formed of a silicon oxide film.

The plurality of second transistors 225 are formed disposed on the second substrate layer 200. Although the second transistors 225 nay have the same structure as the first transistors 125, which are located below the second transistors 225, the present invention is not limited to such an arrangement. When the second transistors 225 have the same structure as the first transistors 125, the method of formation of the second transistors 225 may be substantially the same as the method of formation of the first transistors 125. The etching stop film 240 is shown conformally formed on the second transistors 225.

Figure 4:
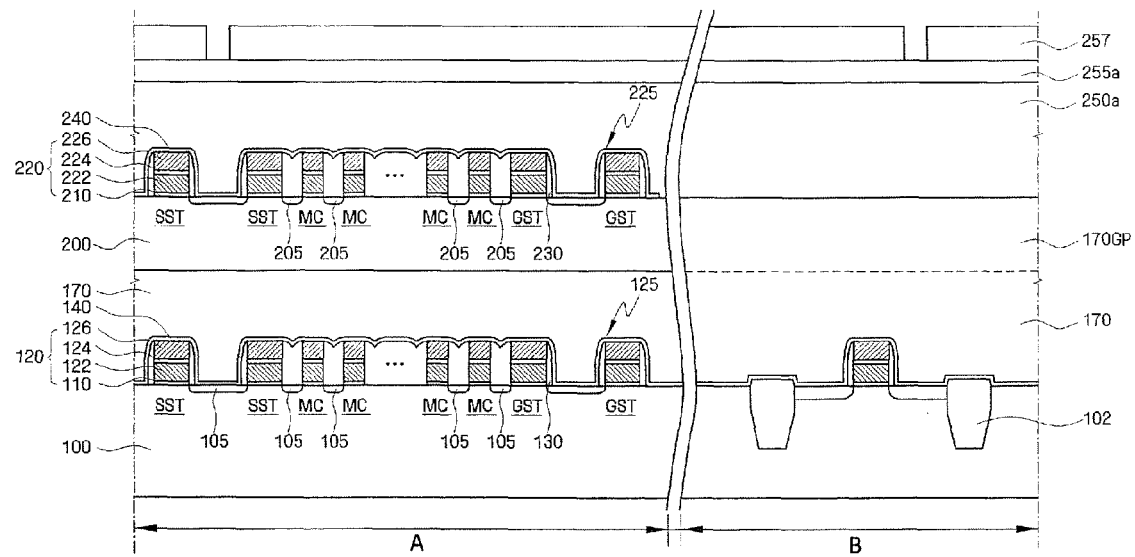

Referring to FIG. 4, a first mask-patterning film 250a, a second mask-patterning film 255a, and a photo-resist pattern 257 are shown sequentially formed on the structure of FIG. 3. The first mask-patterning film 250a may be formed using an organic material containing carbon by means of, for example, a CVD method or coating. The second mask-patterning film 255a may be an anti-reflective coating (ARC) film. The photo-resist pattern 257 may be formed to expose a part of the second mask-patterning film 255a that overlaps the position where the lower contact 282 (FIG. 2) will be formed.

Figure 5:
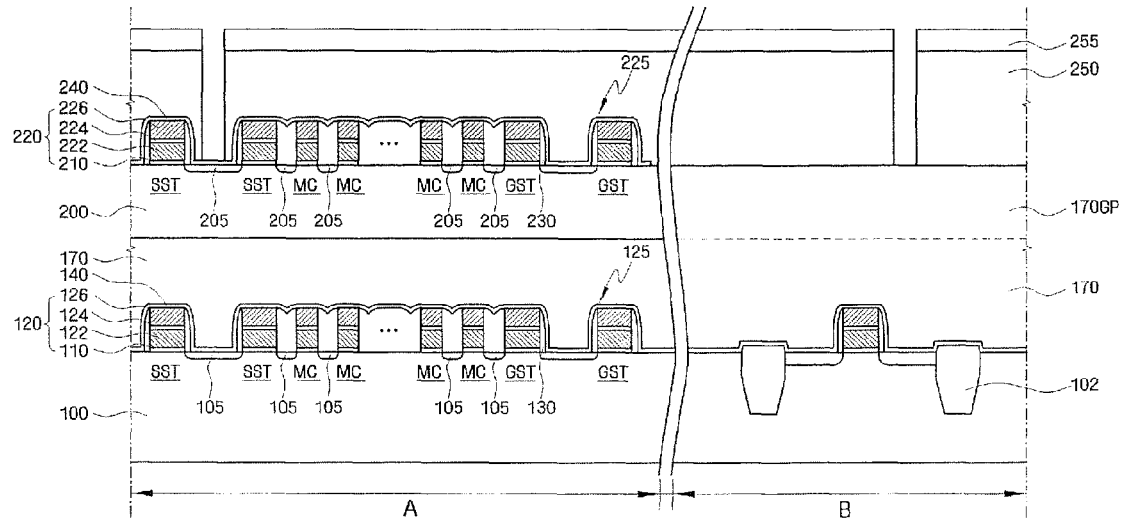

Referring to FIG. 5, the second mask-patterning film 255a (FIG. 4) and the first mask-patterning film 250a (FIG. 4) are etched, using the photo-resist pattern as an etching mask, until the etching stop film 240 is exposed. As the result, a first mask pattern 250 and a second mask pattern 255 are formed to expose a part of the etching stop film 240 on the second substrate layer 200 and a part of the gap-filling interlayer insulating film 170GP. Methods of forming of a mask pattern and a patterning process need not be described further herein.

Figure 6:
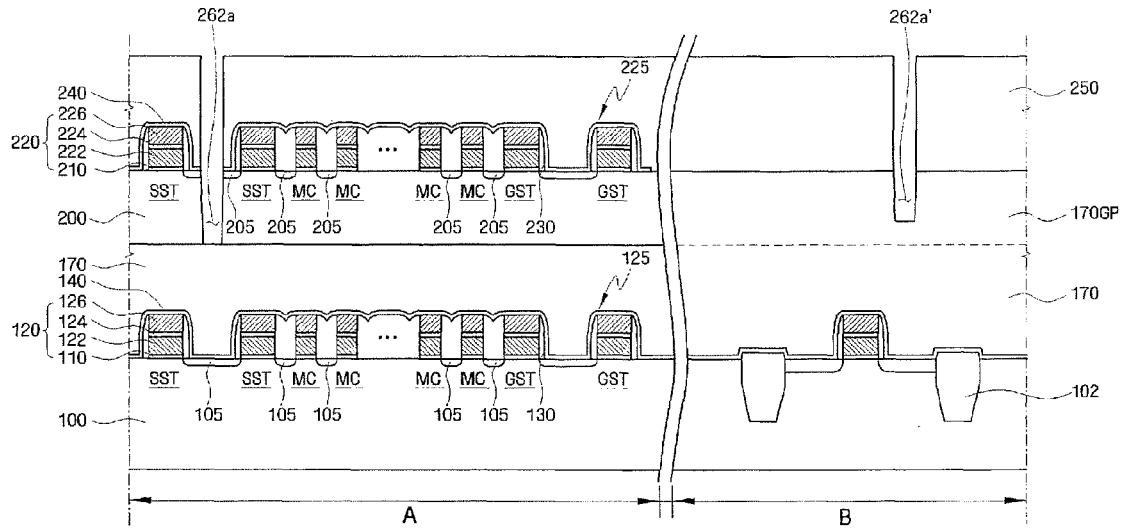

Referring to FIG. 6, the second substrate layer 200 is etched using the second mask pattern 255 (FIG. 5) and the first mask pattern 250 as etching masks. At this time, a part of the gap-filling interlayer insulating film 170GP in the peripheral circuit region B is also etched. Preliminary lower contact holes 262a and 262a' are formed in the second substrate layer 200 and the first interlayer insulating film 170, respectively. In this operation, the second mask pattern 255 may be removed while the second substrate layer is being etched.

Figure 7:
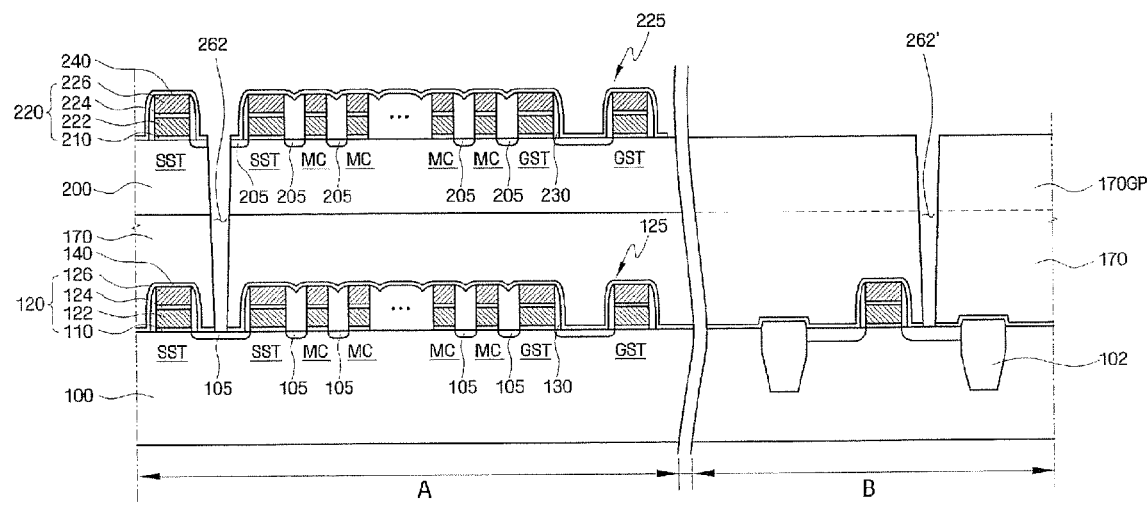

Referring to FIG. 7, the preliminary lower contact holes 262a and 262a' are etched using the first mask pattern 250 (FIG. 6) as an etching mask, such that lower contact holes 262 and 262' can be formed to expose the top of the source/drain region 105 of the first transistor 125. A dry etching method may be used in this operation.

Then, the first mask pattern 250 (FIG. 6), which was used for formation of the lower contact holes 262 and 262', is removed. The removal of the first mask pattern 250 (FIG. 6) may be performed using an ashing and/or strip process.

Although not illustrated in drawings, an insulating film may be formed on the sidewalls of the second substrate layer 200, which are exposed due to the lower contact hole 262 in the cell array region A formed on the second substrate layer 200, in order to electrically insulate the sidewalls from the lower contact to be formed therein.

Figure 8:
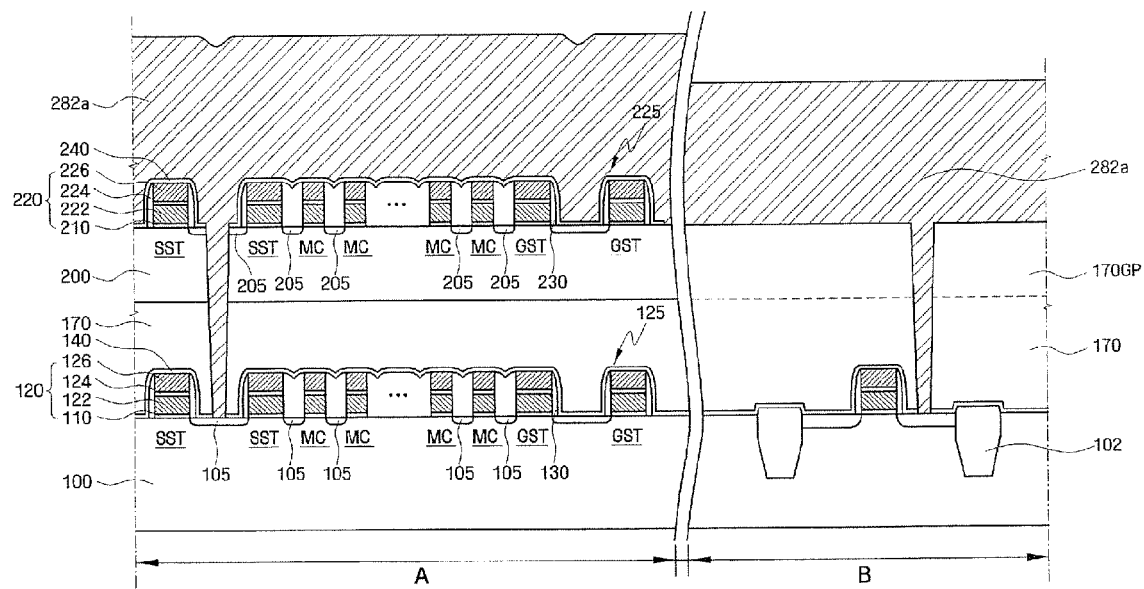

Referring to FIG. 8, a lower contact conductive film 282a fills the lower contact holes 262 and 262' (FIG. 7). The lower contact conductive film 282a may be formed by, for example, a CVD and/or ALD process.

Figure 9:
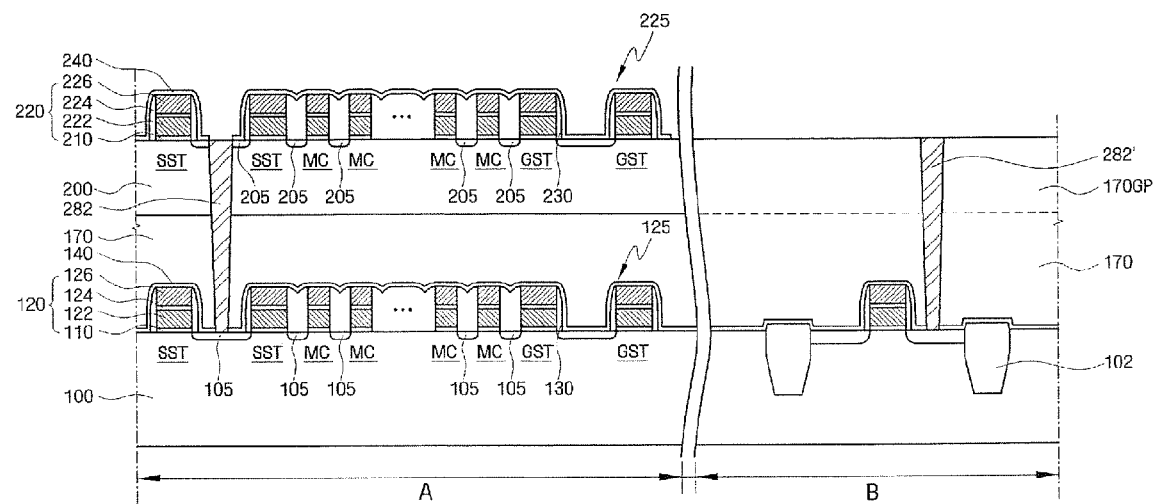

Referring to FIG. 9, lower contacts 282 and 282' are formed, for example, by an etch-back process of a part of the lower contact conductive film 282a (FIG. 8) that is higher than the top surface of the second substrate layer 200 and the top surface of the gap-filling interlayer insulating film 170GP. The bottom surface of each lower contact 282 and 282' touches the source/drain region 105 of the first transistor 125 disposed on the first semiconductor layer 100.

In the cell array region A, the top surface of the lower contact 282 is located on the surface of the second substrate layer 200 or within the second substrate layer 200. That is, in the course of removing the excessive lower contact conductive film 282a, over-etching may occur. When over-etching occurs, the top surface of the lower contact 282 may be formed in the second substrate layer 200 (i.e., at a level below the top surface) by partially recessing into the surface of the second substrate layer 200. Like the lower contact 282 in the cell array region A, the top surface of the lower contact 282' in the peripheral circuit region is located on the surface of the gap-filling interlayer insulating film 170GP or within the gap-filling interlayer insulating film 170GP.

Figure 10:
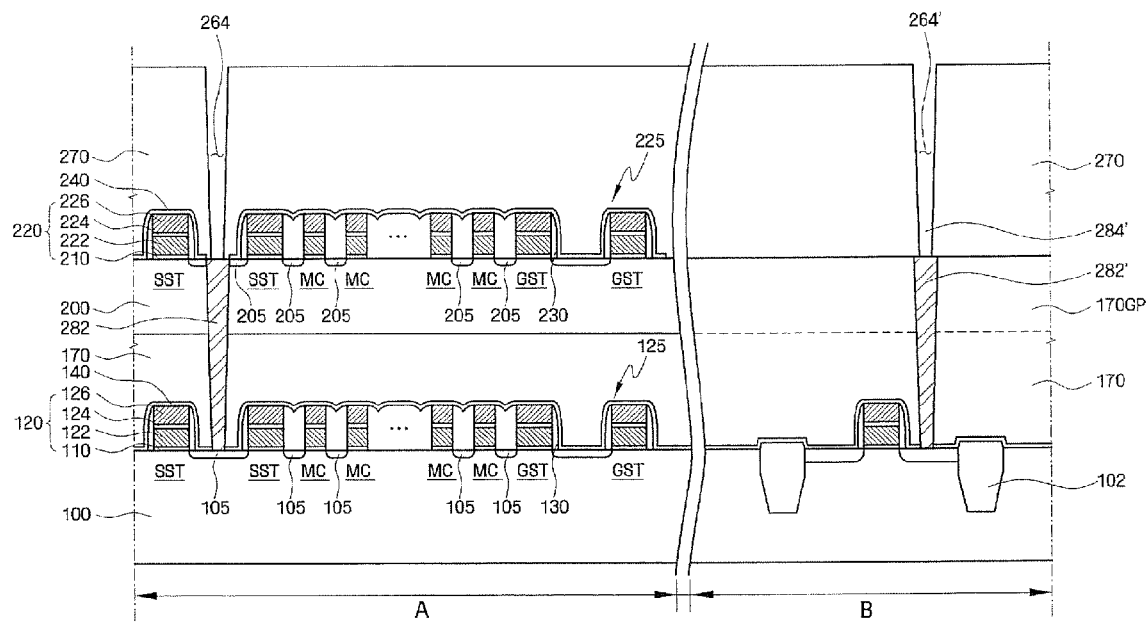

Referring to FIG. 10, the second interlayer insulating film 270 is formed to cover the resultant structure of FIG. 9, and upper contact holes 264 and 264' are formed that expose the top surfaces of the lower contact holes 282 and 282'. The formation processes of the second interlayer insulating film 270 and the upper contact holes 264 and 264' may be the substantially same as those described with reference to the first interlayer insulating film 170 and the lower contact holes 262 and 262' (FIG. 7).

Referring again to FIG. 1, the upper contacts 284 and 284' are formed in the upper contact holes 264 and 264' (FIG. 10), and the bit line 290 is formed on the second interlayer insulating film 270 so as to be connected to the upper contacts 284 and 284'. The lower contacts 282 and 282' and the upper contacts 284 and 284' form a bit line contact.

As described above, according to some embodiments of the present invention, a contact is completely made by forming lower contacts after disposing a second substrate layer and second transistors and then forming upper contacts, each of which is connected to corresponding ones of the lower contacts, after forming a second interlayer insulating film. As such, when the interface between the lower contact and the upper contact is formed on the surface of the second substrate layer, on or within the surface of a source/drain region of a second transistor, or on or within the surface of a gap-filling interlayer insulating film, the aspect ratio of the lower contacts and the upper contacts may be reduced Thus bowing and the formation of contact cracks may be limited or even prevented. Also, a process margin of a contact formation process in a laminating structure of semiconductor layers can be improved.

Although the semiconductor layers (semiconductor substrates) are laminated in two layers in the embodiments described above, even when semiconductor layers (semiconductor substrates) are laminated in three or more layers, a process margin of contact formation can be improved using substantially similar methods as described above for subsequent layers.

Figure 11:
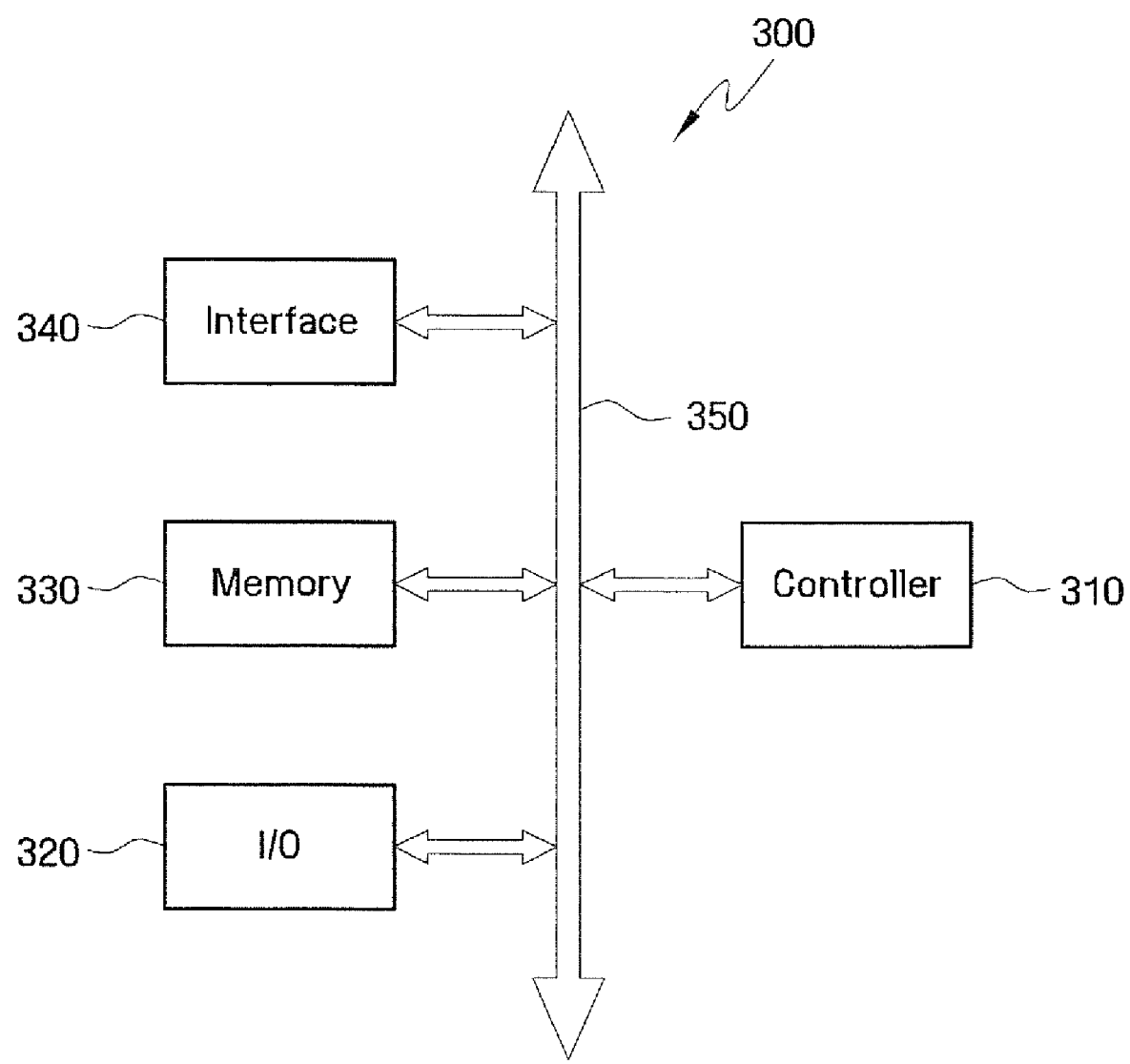
FIG. 11 is a schematic diagram of a memory system employing an integrated circuit device according to some embodiments of the present invention.

A memory system including the above described integrated circuit device will now be described. FIG. 11 is a schematic diagram of a memory system 300 according to some embodiments of the present invention. Referring to FIG. 11, the memory system 300 may be used, for example, in a mobile system, such as a personal digital assistant (PDA), a portable computer, a web tablet, a wireless phone, a mobile phone, a digital music player, a memory card, or other system transmitting and/or receiving information system.

The memory system 300 includes a controller 310, an input/output (I/O) device 320, such as a keypad, a keyboard and a display, a memory 330, an interface 340, and a bus 350. The memory 330 and the interface 340 communicate with each other through the bus 350.

The controller 310 includes at least one of a microprocessor, a digital signal processor, a micro controller and/or the like. The memory 330 may be used, for example, to store commands executed by the controller 310. The memory 330 includes a non-volatile integrated circuit device as described for various embodiments above. The interface 340 sends data to a communication network, and receives data from the network.

According to some embodiments of the present invention, in a semiconductor integrated circuit device and a method of fabricating the semiconductor integrated circuit device, the aspect ratio of lower contacts and upper contacts is reduced so that bowing or contact cracks can be limited or even prevented. Moreover, the process margin of a contact formation process in a laminating structure of semiconductor layers can be improved.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming an integrated circuit device, comprising:
    forming a plurality of first transistors on a first substrate layer;
    forming a first interlayer insulating film that covers the plurality of transistors;
    forming a second substrate layer on the first interlayer insulating film;
    forming a plurality of second transistors on the second substrate layer;
    forming a lower contact that extends through the second substrate layer and the first interlayer insulating film, a top surface of the lower contact being located at a height no greater than a height of a top surface of the second substrate layer and greater than a height of a bottom surface of the second substrate layer;
    forming a second interlayer insulating film that covers the lower contact and the plurality of second transistors; and
    forming an upper contact that extends through the second interlayer insulating film to contact the top surface of the lower contact.

2. The method of claim 1, wherein a bottom surface of the lower contact contacts a source/drain region associated with the plurality of first transistors.

3. The method of claim 2, wherein forming the lower contact comprises:
    forming a first mask pattern and a second mask pattern on the second substrate layer;
    etching the second substrate layer and the first interlayer insulating layer film to form a lower contact hole that exposes a part of the source/drain region using the first and second mask patterns as etching masks;
    filling the lower contact hole with a lower contact conductive film; and
    removing a portion of the lower contact conductive film that exceeds a height of the top surface of the second substrate layer.

4. The method of claim 3, wherein filling the lower contact hole is preceded by removing the first and second mask patterns.

5. The method of claim 3, wherein forming the first and second mask patterns comprises:
    sequentially forming first and second mask-patterning films on the second substrate layer including the plurality of second transistors;
    forming a photo-resist pattern on the second mask-patterning film; and
    etching the second mask-patterning film and the first mask-patterning film using the photo-resist pattern as an etching mask to faun the first and second mask pattern.

6. The method of claim 5, wherein the first mask-patterning film comprises an organic material containing carbon and wherein forming the first mask-patterning film comprises forming the first mask-patterning film by a chemical vapor disposition method and/or a coating method.

7. The method of claim 1, wherein each of the first transistors includes a gate structure that includes a tunneling film, a floating gate, an inter-gate insulating film, and a control gate.

8. The method of claim 1, wherein forming the upper contact is followed by forming a bit line on the second interlayer insulating film, the bit line being connected to the upper contact.

9. The method of claim 1, wherein the first substrate layer comprises a semiconductor substrate and the second substrate layer comprises a semiconductor substrate bonded to the first interlayer insulating film, an epitaxy layer, or a silicon layer that is single-crystallized or polycrystallized after deposition.

10. The method of claim 1, wherein the upper contact directly contacts the top surface of the lower contact.

11. The method of claim 1, wherein at least one of the lower contact and the upper contact extend into a source/drain region associated with the plurality of second transistors.

12. The method of claim 11, wherein the plurality of first transistors is coupled to form a NAND-type circuit and wherein the plurality of second transistors is coupled to form a NAND-type circuit.

13. The method of claim 12, wherein a bottom surface of the lower contact contacts a source/drain region associated with the plurality of first transistors.

14. The method of claim 12, wherein the plurality of first transistors includes a string selection transistor, a plurality of memory cell transistors and a ground selection transistor and wherein the plurality of second transistors includes a string selection transistor, a plurality of memory cell transistors and a ground selection transistor.

15. The method of claim 11, wherein the lower contact and the upper contact penetrate the source/drain region associated with the plurality of second transistors.

16. The method of claim 1, wherein the plurality of first transistors is coupled to form a NAND-type circuit.

17. The method of claim 16, wherein the plurality of first transistors includes a string selection transistor, a plurality of memory cell transistors and a ground selection transistor.

18. The method of claim 1, wherein the second substrate layer is formed directly on the first interlayer insulating film.

19. The method of claim 1, wherein forming the first interlayer insulating film is preceded by conformally forming an etching stop film directly on the plurality of first transistors and the first substrate layer and wherein the first interlayer insulating film is formed directly on the etching stop film.

20. The method of claim 19, wherein the lower contact extends through the etch stop film and a bottom surface of the lower contact contacts a source/drain region associated with the plurality of first transistors.

21. The method of claim 1, wherein the upper and lower contacts are aligned.

* * * * *